(12) United States Patent
Lin et al.

(10) Patent No.: US 7,348,211 B2
(45) Date of Patent: *Mar. 25, 2008

(54) METHOD FOR FABRICATING SEMICONDUCTOR PACKAGES

(75) Inventors: Ying-Ren Lin, Taichung Hsien (TW); Ho-Yi Tsai, Taichung Hsien (TW); Chien-Ping Huang, Hsinchu Hsien (TW); Cheng-Hsu Hsiao, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 291 days.

This patent is subject to a terminal disclaimer.

(21) Appl. No.: 11/117,158

(22) Filed: Apr. 27, 2005

(65) Prior Publication Data

US 2005/0287707 A1  Dec. 29, 2005

(30) Foreign Application Priority Data

Jun. 24, 2004  (TW) ................ 93118246 A

(51) Int. Cl.
*H01L 21/50* (2006.01)
*H01L 21/48* (2006.01)
*H01L 21/44* (2006.01)

(52) U.S. Cl. ............. 438/106; 438/107; 438/110; 438/113; 438/126; 438/127

(58) Field of Classification Search ........ 438/106–107, 438/110, 113, 126–127
See application file for complete search history.

(56) References Cited

U.S. PATENT DOCUMENTS

| 5,609,889 | A | * | 3/1997 | Weber ................... 425/116 |
| 5,918,746 | A | * | 7/1999 | Tokita et al. ............ 206/716 |
| 5,958,466 | A | * | 9/1999 | Ong ...................... 425/127 |
| 6,038,136 | A | | 3/2000 | Weber |
| 6,444,498 | B1 | | 9/2002 | Huang et al. |
| 6,699,731 | B2 | | 3/2004 | Huang et al. |
| 6,830,957 | B2 | | 12/2004 | Pu et al. |
| 6,870,249 | B2 | * | 3/2005 | Egawa .................. 257/686 |

* cited by examiner

*Primary Examiner*—Luan Thai
(74) *Attorney, Agent, or Firm*—Peter F. Corless; Steven M. Jensen; Edwards Angell Palmer & Dodge LLP

(57) ABSTRACT

A method for fabricating semiconductor packages is proposed. A plurality of substrates each having a chip thereon are prepared. Each substrate has similar length and width to the predetermined length and width of the semiconductor package. A carrier having a plurality of openings is prepared. Each opening is larger in length and width than the substrate. The substrates are positioned in the corresponding openings, and gaps between the substrates and the carrier are sealed. A molding process is performed to form an encapsulant over each opening to encapsulate the chip. An area on the carrier covered by the encapsulant is larger in length and width than the opening. After performing a mold-releasing process, a plurality of the semiconductor packages are formed by a singulation process to cut along substantially edges of each substrate according to the predetermined size of the semiconductor package. A waste of substrate material is avoided.

26 Claims, 16 Drawing Sheets

METHOD FOR FABRICATING SEMICONDUCTOR PACKAGES

FIELD OF THE INVENTION

The present invention relates to methods for fabricating semiconductor packages, and more particularly, to a method using a substrate carrier to fabricate ball grid array (BGA) semiconductor packages.

BACKGROUND OF THE INVENTION

Flip-chip ball grid array (FCBGA) semiconductor package relates to a combination of flip chip and ball grid array, which allows an active surface of at least one chip mounted therein to be electrically connected to a surface of a substrate via a plurality of solder bumps, and a plurality of solder balls to be implanted on another surface of the substrate, wherein the solder balls serve as input/output (I/O) connections for the semiconductor package. This semiconductor package yields significant advantages to effectively decrease the package size, reduce resistance and improve electrical performances to prevent decay of signals during transmission without using conventional bonding wires. Therefore, the FCBGA semiconductor package is considered providing a major packaging technology for chips and electronic elements of the next generation.

As shown in FIG. 10, a FCBGA semiconductor package comprises a substrate 70; a chip 71 mounted on and electrically connected to an upper surface of the substrate 70 in a flip-chip manner; and a plurality of solder balls 72 implanted on a lower surface of the substrate 70, for electrical connection with an external device. The semiconductor package further comprises an encapsulant 73 formed on the upper surface of the substrate 70 by a molding process for encapsulating the chip 71. Related prior arts include U.S. Pat. Nos. 6,038,136, 6,444,498, 6,699,731 and 6,830,957, which have disclosed similar package structures to improve the electrical performances of packages and satisfy the requirements for advanced electronic products.

U.S. Pat. No. 6,830,957 uses a method to increase the length and width of the substrate 70 for fabricating the semiconductor package. As shown in FIG. 11, the substrate 70 is received in a substrate carrier 75, and a clamping area a is provided as an extension from each side of the substrate 70 to make the substrate 70 larger in size than a mold cavity 81 of an encapsulating mold 80. Thereby, the substrate 70 can be well clamped by the mold 80, and the encapsulant 73 would not flash to the lower surface of the substrate 70 to damage the bondability of ball pads 74 on the substrate 70 where the solder balls 72 are to be implanted. For a single package conventionally having the substrate 70 sized 31 mm×31 mm (as shown in FIG. 10), the clamping area a must be at least 0.6 mm in width to provide a good flash-preventing effect. Accordingly, a portion of at least 1.2 mm that is to be eventually cut off is added respectively to the length and width of the substrate 70, making the material required for the substrate 70 and overall fabrication costs of the package undesirably increased (the substrate cost is generally more than 60% of the overall costs of the flip-chip package).

The cost associated with the substrate 70 is actually more than that described above as compared to the singulated package product shown in FIG. 10. This is because as shown in FIG. 12, a mold-releasing angle 82 must be formed at an edge of the encapsulant 73 in contact with the substrate 70 according to the shape of the mold cavity 81 in order to successfully release the mold 80 after the molding process is complete. Generally, the mold-releasing angle 82 should not be larger than 60° to provide a satisfactory mold-releasing effect. Accordingly, for a single package with the substrate 70 having the size of 31 mm×31 mm, an additional portion b of at least 0.58 mm corresponding to the mold-releasing angle 82 of the encapsulant 73 is required and formed as an extension from each side of the substrate 70. In other words, a portion of 1.16 mm that is to be eventually cut off is added respectively to the length and width of the substrate 70. Further, a cutting path c of 0.3 mm at each side of the substrate 70 is reserved for a singulation process, which leads to an addition of 0.6 mm respectively in the length and width of the substrate 70. Therefore, to have a final package with the substrate 70 of a size of 31 mm×31 mm, the substrate 70 during fabrication of the package must be sized (31+1.2+1.16+0.6) mm×(31+1.2+1.16+0.6) mm in length and width. The increase of substrate size not only causes a waste of substrate utilization but also makes the overall costs increased by about 15 to 20%.

The foregoing drawback leads to significant difficulty in fabrication of the BGA semiconductor package. The molding process for forming the encapsulant 73 is an essential step in the package fabrication, however it makes the size and material cost of the substrate 70 increased, thereby not advantageous for mass production.

Therefore, the problem to be solved here is to provide a method for fabricating semiconductor packages, which can reduce the size and cost of a substrate, prevent resin flashes, and overcome mold-releasing difficulty, to be in favor of mass production.

SUMMARY OF THE INVENTION

In light of the above drawbacks in the conventional technology, a primary objective of the present invention is to provide a method for fabricating semiconductor packages, which can reduce the substrate cost.

Another objective of the present invention is to provide a method for fabricating semiconductor packages, which does not require an increase in length and width of a substrate.

A further objective of the present invention is to provide a method for fabricating semiconductor packages, which can prevent flashes of an encapsulant without increasing the size of a substrate.

In accordance with the above and other objectives, the present invention proposes a method for fabricating semiconductor packages, comprising the steps of: preparing a plurality of substrates, wherein each of the substrates has similar or substantially equal length and width to predetermined length and width of the semiconductor package respectively, and mounting at least one chip on each of the substrates; preparing a carrier having a plurality of openings, wherein each of the openings is larger in length and width than each of the substrates; positioning the plurality of substrates respectively in the plurality of openings of the carrier, and sealing gaps between the substrates and the carrier so as to prevent an encapsulant formed by a subsequent molding process from flashing to unintended areas of the substrates; performing the molding process to form the encapsulant over each of the openings to encapsulate the corresponding chip, wherein an area on the carrier covered by the encapsulant is larger in length and width than the corresponding opening; performing a mold-releasing process; and performing a singulation process to cut along substantially edges of each of the substrates according to the predetermined length and width of the semiconductor package so as to form a plurality of the semiconductor packages.

In the present invention, a filling material such as a solder mask can be used to fill and seal the gaps between the substrates and the carrier to fix the substrates in the openings. Alternatively, at least one tape can be attached to the substrates and the carrier to cover the openings and the gaps between the substrates and the carrier, so as to seal the gaps and fix the substrates in the openings.

The length and width of the substrate are slightly larger by 0.1 to 0.5 mm respectively than the predetermined length and width of the semiconductor package, and the length and width of the opening are slightly larger by 0.1 to 0.5 mm respectively than those of the substrate. Alternatively, the length and width of the substrate can be slightly smaller by 0.1 to 0.5 mm respectively than the predetermined length and width of the semiconductor package, such that the length and width of the opening are slightly larger by 0.1 to 1.0 mm respectively than the predetermined length and width of the semiconductor package.

The carrier can be made of an organic insulating material such as FR4, FR5, BT (bismaleimide triazine), and so on. Alternatively, a metal carrier can be used in the present invention to fabricate desirable semiconductor packages in a cost-effective manner. This fabrication method using the metal carrier comprises the steps of: preparing a plurality of substrates, wherein each of the substrates has similar or substantially equal length and width to predetermined length and width of the semiconductor package respectively, and mounting at least one chip on each of the substrates; preparing the metal carrier having a plurality of openings, wherein each of the openings is larger in length and width than each of the substrates; positioning the plurality of substrates respectively in the plurality of openings of the metal carrier, and sealing gaps between the substrates and the metal carrier to prevent the gaps from penetrating the metal carrier; performing a molding process to form an encapsulant over each of the openings to encapsulate the corresponding chip, wherein the corresponding substrate, chip and encapsulant form a single package unit, and an area on the carrier covered by the encapsulant is larger in length and width than the corresponding opening; performing a mold-releasing process; separating the package units from the metal carrier; and performing a singulation process to cut along substantially edges of each of the substrates of the package units according to the predetermined length and width of the semiconductor package so as to form a plurality of the semiconductor packages.

The metal carrier can be made of a copper (Cu) material, and a surface thereof is plated with a metal layer that is poorly adhesive to the encapsulant. The metal layer can be made of a metal material such as gold (Au), nickel (Ni), or chromium (Cr), etc. By virtue of the poor adhesion between the plated metal layer and the encapsulant, the package units can be easily separated from the metal carrier and thus provide convenience in fabrication.

Therefore, according to the foregoing arrangement in the present invention, the substrate can have similar or substantially equal length and width to the predetermined length and width of the semiconductor package respectively, without having to over size the substrate. Moreover, the gaps between the substrates and the carrier are sealed, and the area on the carrier covered by the encapsulant is larger than the size of the opening of the carrier by using a mold cavity having coverage larger in length and width than the opening, such that resin flashes during the molding process and difficulty in mold releasing can be prevented. As a result, unnecessary increase in size and material of the substrate is avoided, thereby overcoming the drawbacks in the conventional technology.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

Figure 1A:
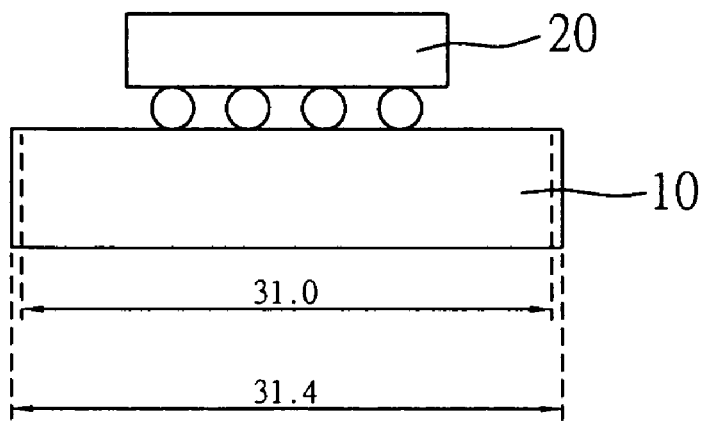
FIGS. 1A to 1H are schematic diagrams showing steps of a method for fabricating semiconductor packages according to a first preferred embodiment of the present invention.
Figure 1B:
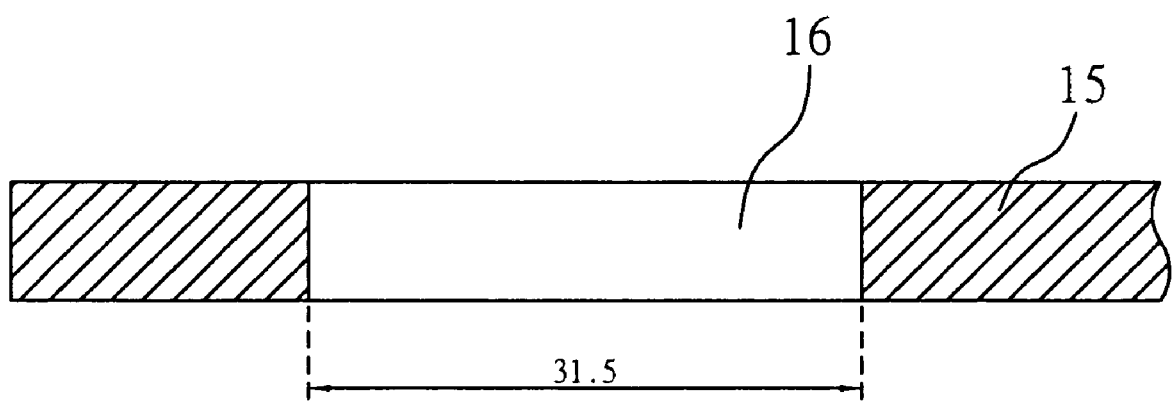
Figure 1C:
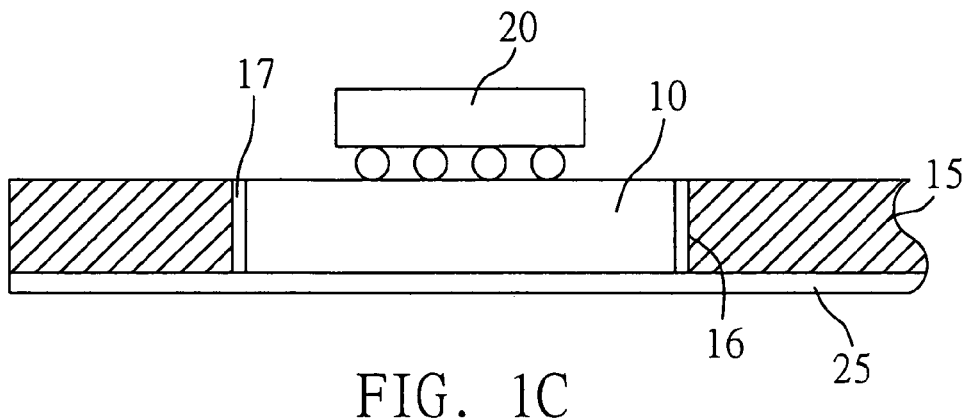

FIGS. 1A to 1H show steps of a method for fabricating semiconductor packages according to a first preferred embodiment of the present invention. Referring to FIG. 1A, firstly, a plurality of build-up substrates 10 (only one is shown) each carrying at least one chip 20 thereon are prepared. Each of the substrates 10 has slightly larger length and width than the predetermined length and width of a final semiconductor package 1 (shown in FIG. 1H) respectively. In this embodiment, the predetermined dimensions of the semiconductor package 1 after singulation are 31 mm×31 mm in length and width, such that the length and width of the substrate 10 are sized 31.4 mm×31.4 mm. Then, referring to FIG. 1B, a substrate carrier 15 having a plurality of openings 16 (only one is shown) is prepared, wherein each of the openings 16 is larger in length and width than each of the substrates 10, such that the substrates 10 carrying the chips 20 thereon can be embedded and positioned in the corresponding openings 16. In this embodiment, the length and width of the opening 16 are sized 31.5 mm×31.5 mm. Subsequently, referring to FIG. 1C, the plurality of substrates 10 are positioned in the plurality of openings 16 (only one is shown) of the carrier 15 respectively, and gaps 17 between the substrates 10 and the carrier 15 are sealed to prevent the gaps 17 from penetrating the carrier 15. In this embodiment, a tape 25 is attached to lower surfaces of the substrates 10 and the carrier 15 to seal all the gaps 17 and fix the substrates 10 in the openings 16. The tape 25 can be made of a thermally resistant polymer material.

Figure 1D:
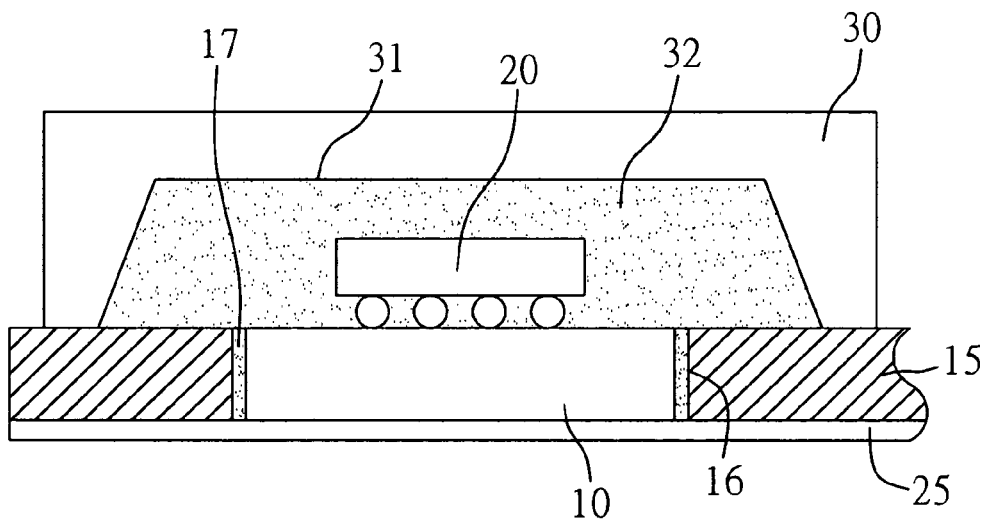

Referring to FIG. 1D, a conventional molding process is performed in which the carrier 15 is placed into a mold 30 and each of the chips 20 is received in a corresponding mold cavity 31 such that an encapsulant 32 (made of a resin material) is formed over each of the openings 16 and encapsulates the corresponding chip 20. In the present invention, the dimensions (31.4 mm×31.4 mm) of the substrate 10 are slightly larger than the predetermined dimensions (31 mm×31 mm) of the semiconductor package 1, and the dimensions (31.5 mm×31.5 mm) of the opening 16 are slightly larger than those (31.4 mm×31.4 mm) of the substrate 10. Further, an area on the carrier 15 covered by the encapsulant 32 is much larger in length and width than the opening 16 as shown in FIG. 1D. The encapsulant 32 injected into the mold cavity 31 flows into the gap 17 between the substrate 10 and the carrier 15, but would not flash to the lower surface of the substrate 10 due to provision of the tape 25 sealing the gap 17. Therefore, it is not necessary to increase the size of the substrate 10 in the present invention to prevent resin flashes and facilitate releasing of the mold 30 (since a mold-releasing angle of the encapsulant 32 corresponds to an area of the carrier 15, not an area of the substrate 10), such that the required size of the substrate 10 can be effectively reduced and fabrication costs of the semiconductor package 1 are greatly diminished.

Figure 1E:
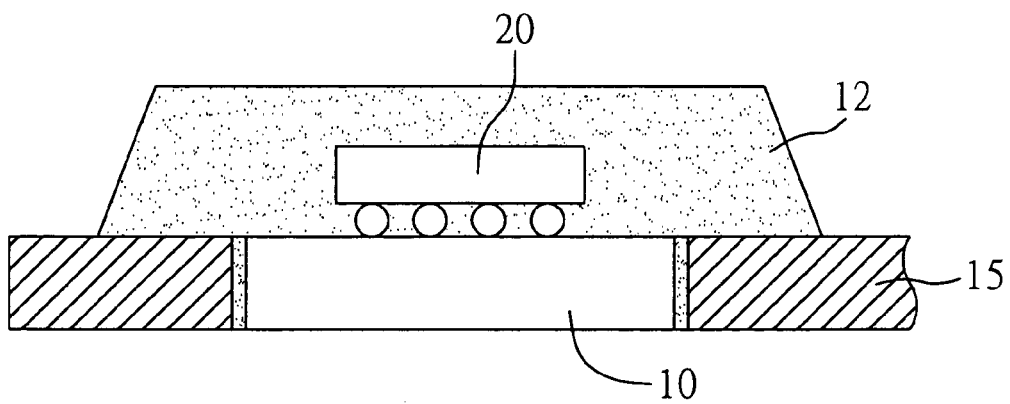
Figure 1F:
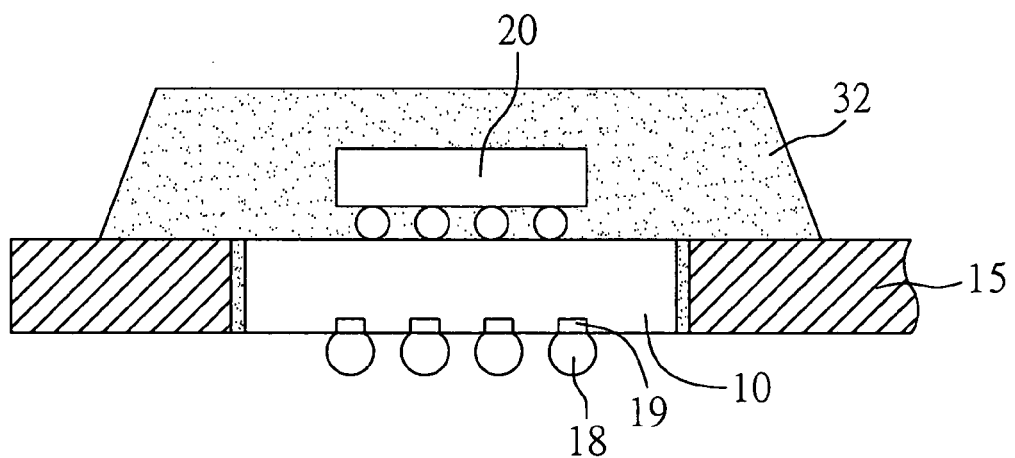
Figure 1G:
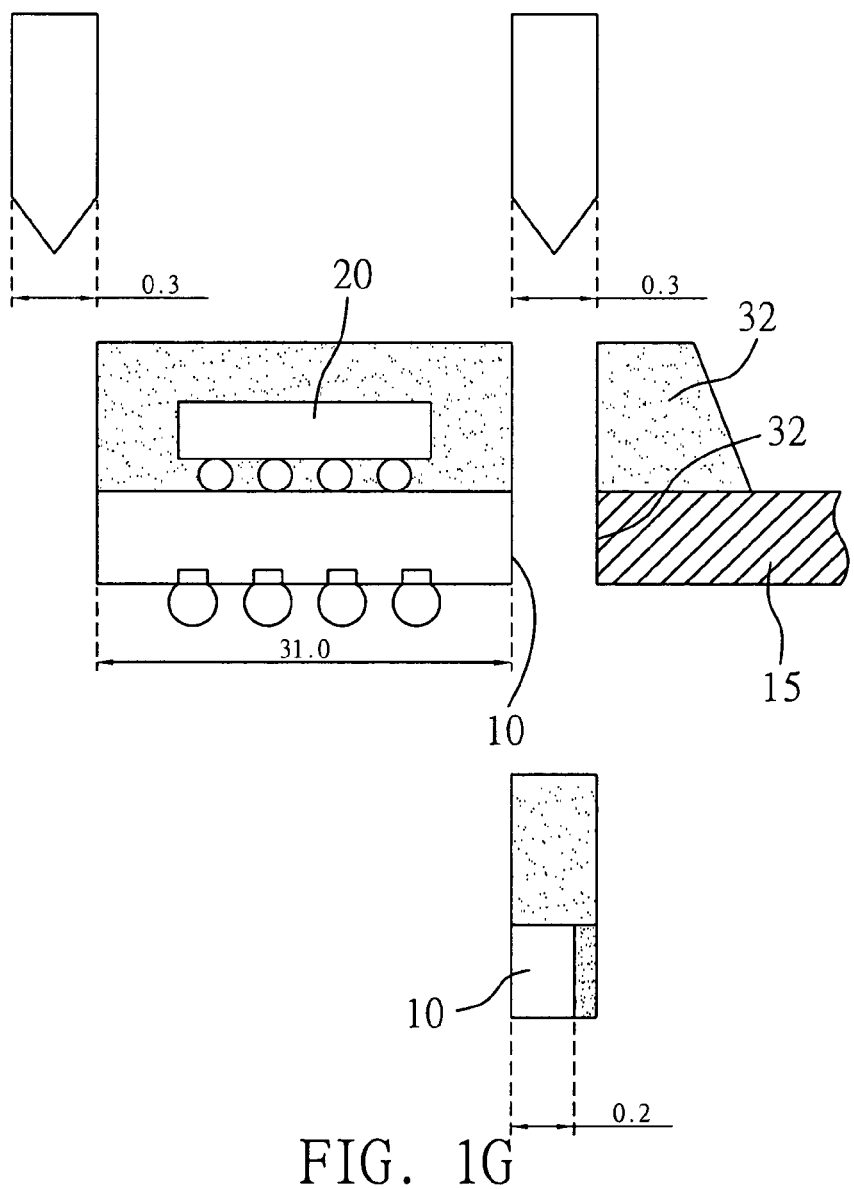
Figure 1H:
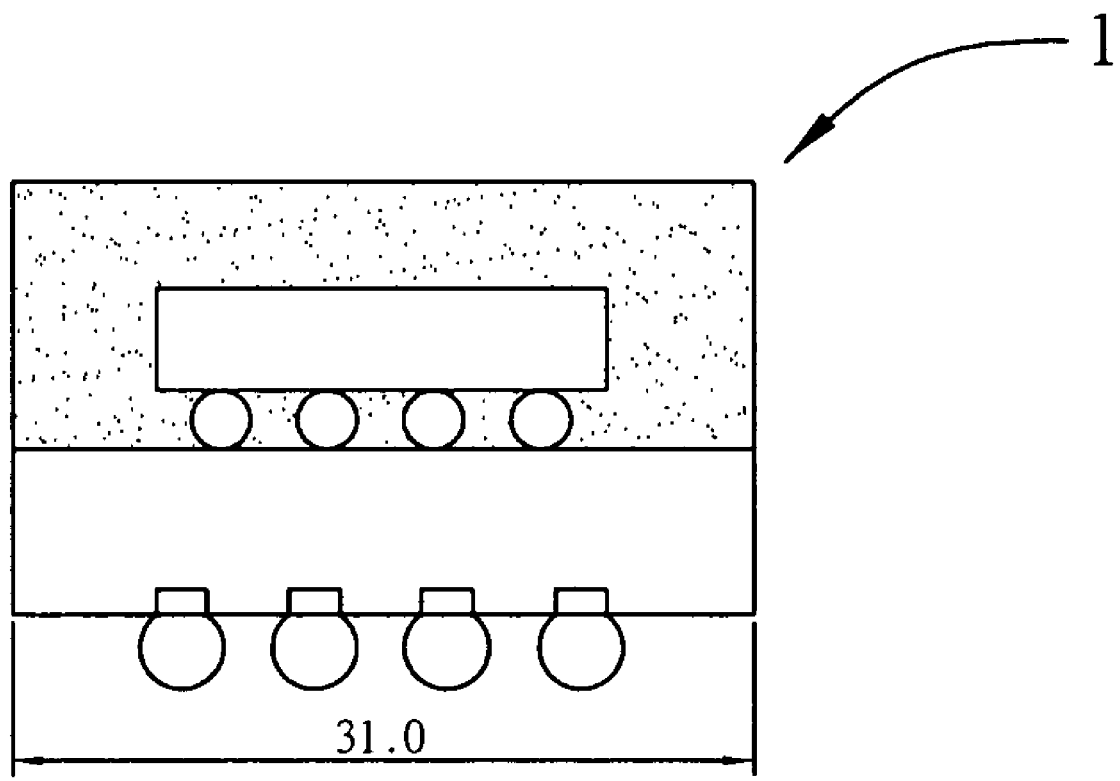
Figure 12:
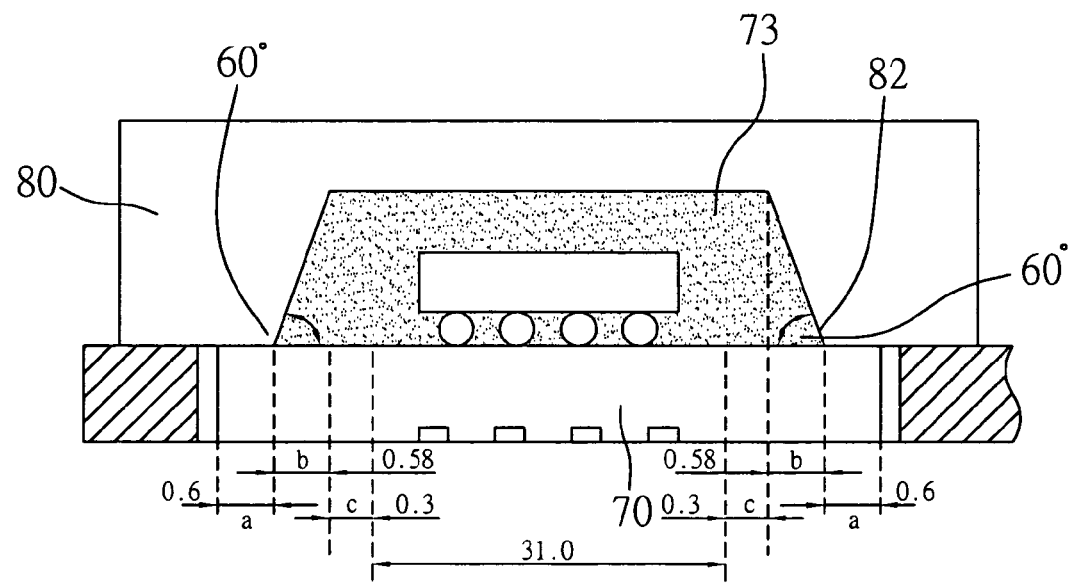

Referring to FIG. 1E, a mold-releasing process is performed to remove the mold 30, and the tape 25 is removed. Subsequently, referring to FIG. 1F, a plurality of solder balls 18 are implanted at ball pads 19 on the lower surface of each of the substrates 10, such that the chip 20 can be electrically connected to an external device via the solder balls 18. Referring to FIG. 1G, a singulation process is performed to cut along cutting lines of each of the substrates 10 according to the predetermined dimensions of the semiconductor package 1. In this embodiment, with the predetermined dimensions of the semiconductor package 1 as 31 mm×31 mm and the dimensions of the substrate 10 as 31.4 mm×31.4 mm, by the singulation process, a portion of 0.2 mm at each side of the substrate 10 is included in a cutting path (0.3 mm wide) and cut off together with the cutting path as shown in FIG. 1G, unlike the conventional technology shown in FIG. 12 that after a cutting path (0.3 mm) has been cut off, a material portion of 1.18 mm (0.6 mm+0.58 mm) at each side of the substrate 70 is discarded together with the carrier 75. Therefore, the present invention can effectively reduce and save a used amount of the substrate material. Finally, referring to FIG. 1H, a plurality of the cost-effective semiconductor packages 1 are thus fabricated.

According to the foregoing embodiment in the present invention, the gaps 17 between the substrates 10 and the carrier 15 are sealed to prevent flashes of the encapsulants 32, and the coverage of the mold cavity 31 used for forming the encapsulant 32 is larger in length and width than the opening 16 of the carrier 15 to facilitate releasing of the mold 30. These features can solve problems of resin flashes and molding releasing in the conventional technology, without having to increase the size of the substrate 10. Therefore, the substrate 10 in the present invention can be effectively reduced in size as compared to the conventional technology, wherein the substrate 10 has similar or substantially equal length and width to the predetermined length and width of the semiconductor package 1, such that an undesirable material discard or waste of the substrate 10 by singulation is avoided.

For the semiconductor package 1 of 31 mm×31 mm in length and width, the length and width of the substrate 10 can be as foregoing described, but not limited to, 31.4 mm×31.4 mm. Alternatively, the side length of the substrate 10 can be sized larger by 0.1 to 0.5 mm than the predetermined side length of the semiconductor package 1. The length and width of the opening 16 of the carrier 15 can be as foregoing described, but not limited to, 31.5 mm×31.5 mm. Alternatively, the side length of the opening 16 can be sized larger by 0.1 to 0.5 mm than that of the substrate 10. Moreover, the carrier 15 can be made of an organic insulating material such as FR4, FR5, BT (bismaleimide triazine), and so on.

Figure 2:
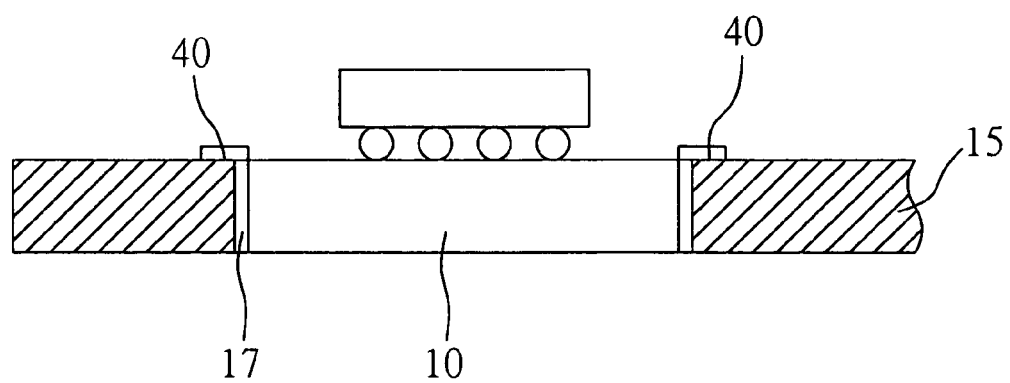
FIG. 2 is a cross-sectional diagram showing another way of sealing a gap between a substrate and a carrier according to the present invention.
Figure 3:
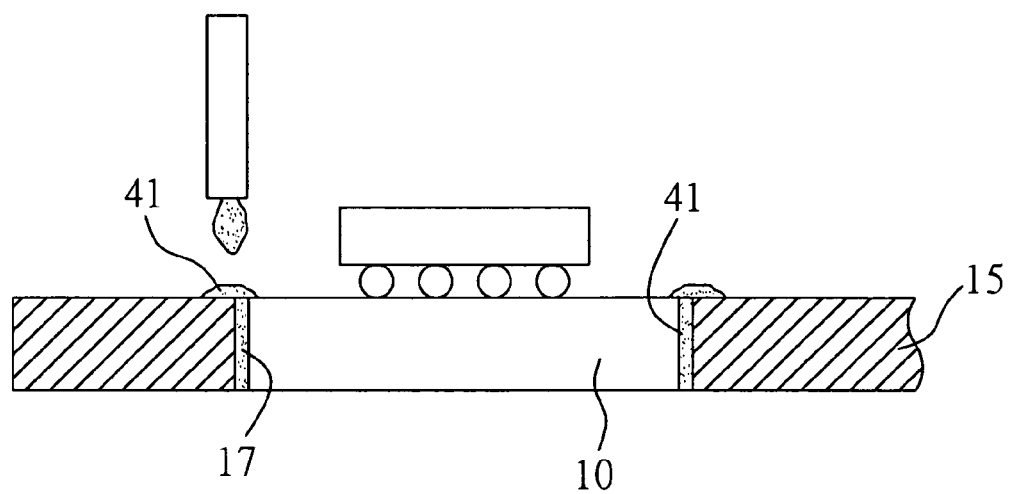
FIG. 3 is a cross-sectional diagram showing a further way of sealing the gap between the substrate and the carrier according to the present invention.

There are various methods for fixing the substrates 10 in the openings 16 of the carrier 15 and sealing the gaps 17 between the substrates 10 and the carrier 15. Besides in the foregoing embodiment attaching the tape 25 to the lower surfaces of the substrates 10 and the carrier 15, another method shown in FIG. 2 is also applicable by using a plurality of small tapes 40 to directly cover and seal the gaps 17 between the substrates 10 and the carrier 15 respectively, which can reduce a used amount of the tape material. A further method shown in FIG. 3 uses a filling material 41 such as a solder mask to fill the gaps 17 between the substrates 10 and the carrier 15 by a dispensing technique so as to fix the substrates 10 in the openings 16 and seal the gaps 17 to prevent resin flashes. Alternatively, the filling material 41 can be a polymer material such as epoxy resin.

Second Preferred Embodiment

Apart from the above first embodiment in which the substrate 10 has slightly larger length and width than the predetermined length and width of the semiconductor package 1, the substrate 10 can be sized slightly smaller in length and width than the semiconductor package 1 to further reduce the material used for the substrate 10 according to a second preferred embodiment shown in FIGS. 4A to 4H wherein similarly, the predetermined size of the semiconductor package 1 after singulation is 31 mm×31 mm in length and width.

Figure 4A:
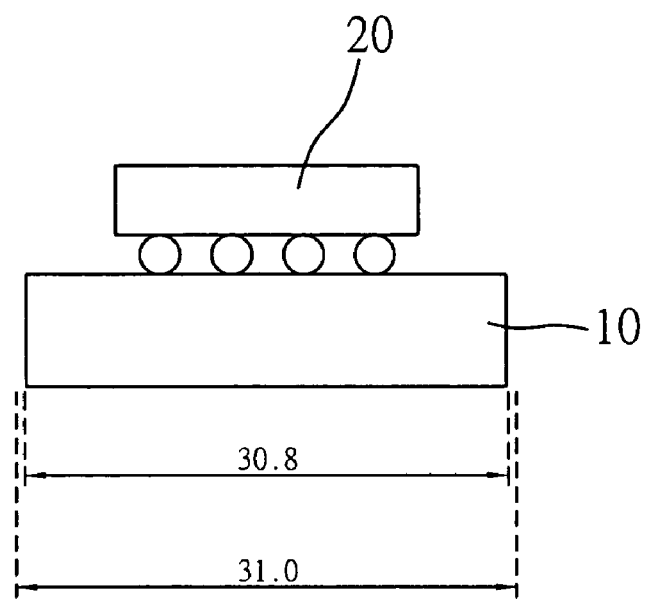
FIGS. 4A to 4H are schematic diagrams showing steps of a method for fabricating semiconductor packages according to a second preferred embodiment of the present invention.
Figure 4B:
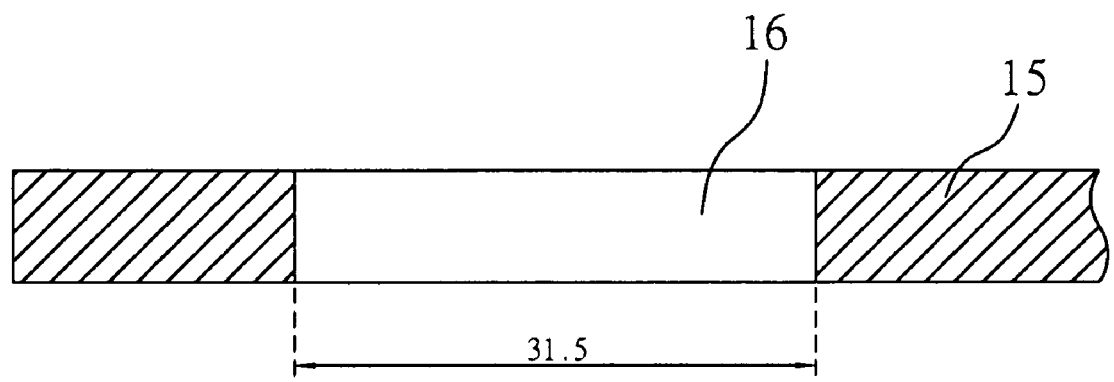
Figure 4C:
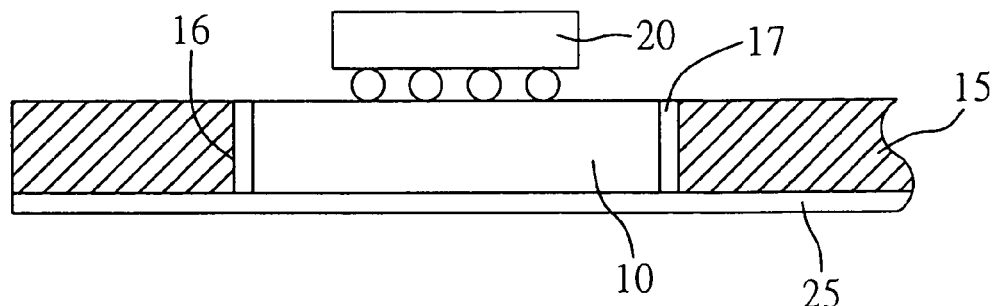
Figure 4D:
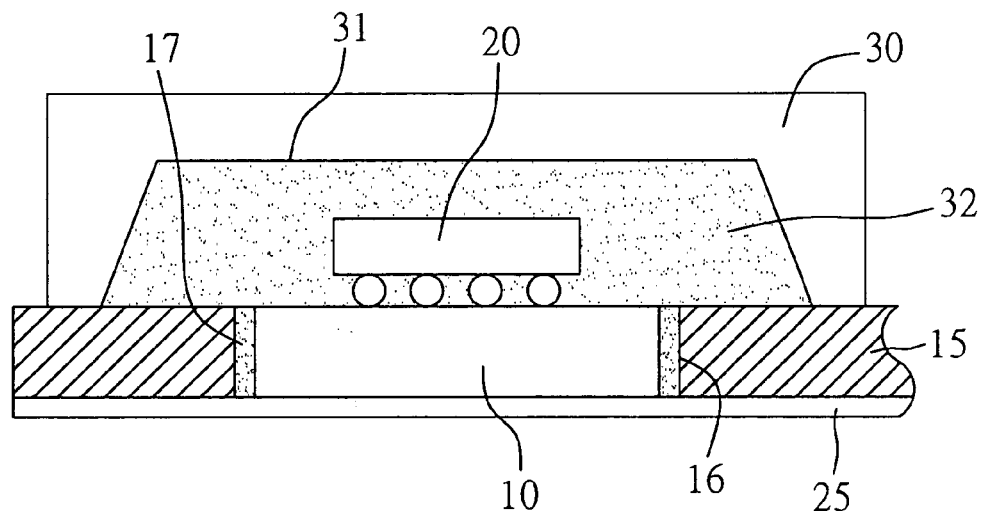
Figure 4E:
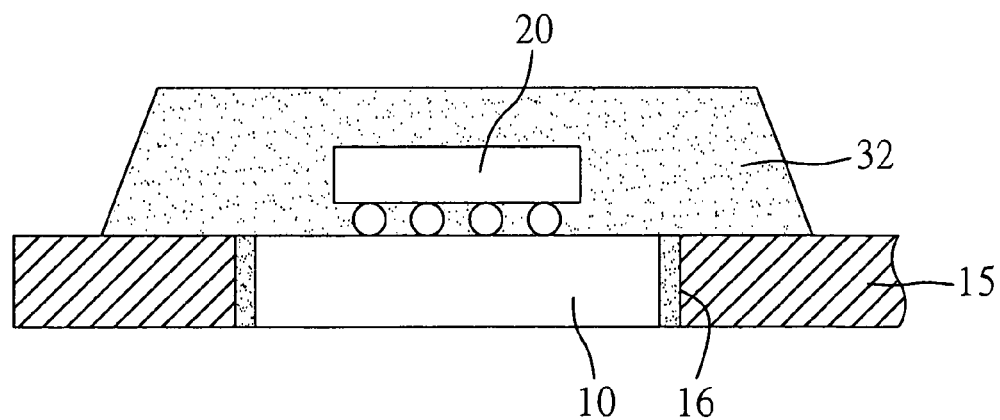
Figure 4F:
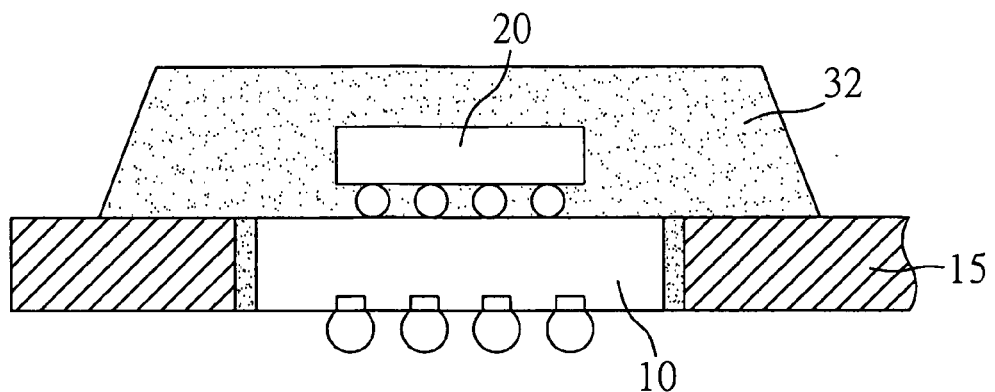

Referring to FIG. 4A, firstly, a plurality of build-up substrates 10 (only one is shown) each carrying at least one chip 20 thereon are prepared. Each of the substrates 10 has its length and width sized 30.8 mm×30.8 mm and slightly smaller than the predetermined length and width of the semiconductor package 1 (31 mm×31 mm as shown in FIG. 4H). Referring to FIG. 4B, a carrier 15 having a plurality of openings 16 (only one is shown) is prepared. Each of the openings 16 has larger length and width than those of the semiconductor package 1, such that the substrates 10 carrying the chips 20 thereon can be embedded and positioned in the corresponding openings 16. In this embodiment, the length and width of the opening 16 are sized 31.5 mm×31.5 mm. Referring to FIG. 4C, the plurality of substrates 10 are positioned in the plurality of corresponding openings 16 (only one is shown) of the carrier 15 respectively, and gaps 17 between the substrates 10 and the carrier 15 are sealed to prevent the gaps 17 from penetrating the carrier 15. In this embodiment, a tape 25 is attached to lower surfaces of the substrates 10 and the carrier 15 to fix the substrates 10 and seal the gaps 17.

Subsequently, referring to FIGS. 4D, 4E and 4F, a molding process, a mold-releasing process, removal of the tape 25 and a process of mounting solder balls are successively performed as those described in the foregoing first embodiment. Similarly in this embodiment, the use of tape 25 can prevent flashes of encapsulants 32 that are formed over the openings 16 of the carrier 15, and the coverage of a mold cavity 31 used for forming the encapsulant 32 is larger in length and width than the corresponding opening 16 of the carrier 15 to facilitate the mold-releasing process, such that the size of the substrate 10 can be desirably reduced.

Figure 4G:
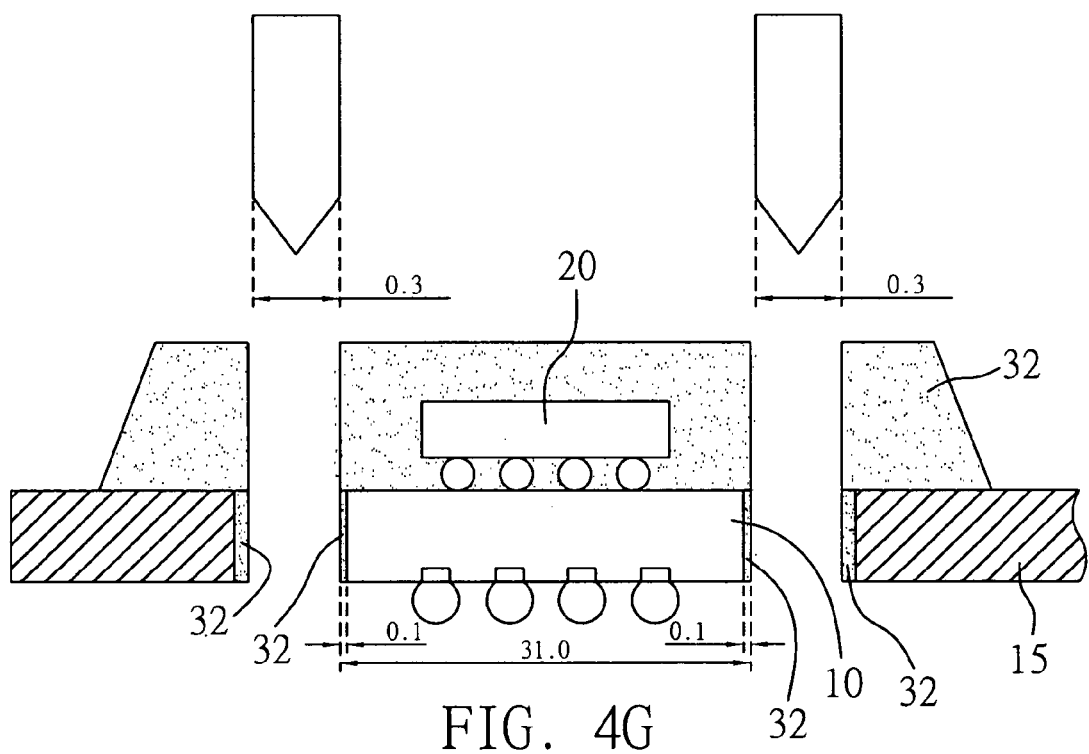
Figure 4H:
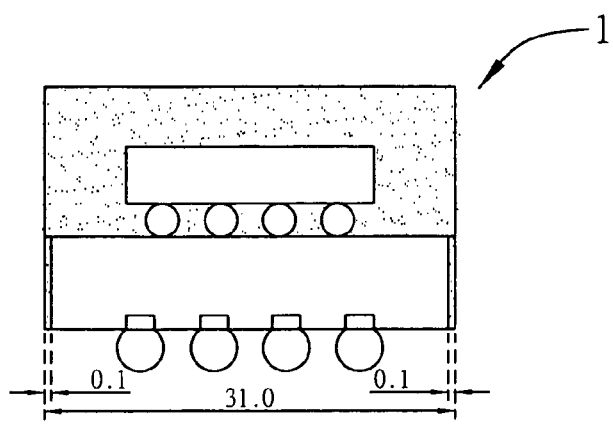

Referring to FIG. 4G, a singulation process is performed to cut along substantially edges of each of the substrates 10 according to the predetermined size of the semiconductor package 1. In this embodiment, as the predetermined length and width of the semiconductor package 1 are 31 mm×31 mm and the length and width of the substrate 10 are 30.8 mm×30.8 mm, after a cutting path (0.3 mm wide) has been cut off, a portion of 0.1 mm of the encapsulant 32 would be included at each side of the substrate 10 in the singulated package 1 as shown in FIG. 4G, unlike the conventional technology shown in FIG. 12 that after a cutting path (0.3 mm) has been cut off, a material portion of 1.18 mm (0.6 mm+0.58 mm) at each side of the substrate 70 is discarded together with the carrier 75. Therefore, the present invention can effectively reduce and save the material and cost of the substrate 10. Referring to FIG. 4H, a plurality of the cost-effective semiconductor packages 1 are thus fabricated.

For the semiconductor package 1 with the length and width of 31 mm×31 mm, the length and width of the substrate 10 can be as foregoing described, but not limited to, 30.8 mm×30.8 mm. Alternatively, the side length of the substrate 10 can be sized smaller by 0.1 to 0.5 mm than the predetermined side length of the semiconductor package 1. The length and width of the opening 16 of the carrier 15 can be as foregoing described, but not limited to, 31.5 mm×31.5 mm. Alternatively, the side length of the opening 16 can be sized larger than that of the semiconductor package 1 by 0.1 to 1.0 mm, preferably 0.5 mm.

Third Preferred Embodiment

Apart from the carrier 15 made of an organic insulating material such as FR4, FR5, BT, and so on, a metal carrier having a metal layer plated on a surface thereof can be used in the present invention according to a third preferred embodiment shown in FIGS. 5A to 5I. The metal layer is made of a material poorly adhesive to the encapsulant 32. In the third embodiment, the predetermined size of the semiconductor package 1, the size of the substrate 10, and the size of an opening 46 of a carrier 45 are all same as those described in the foregoing embodiments. Only the material used for the carrier 45 and some of the fabrication processes in the third embodiment are different from those in the foregoing embodiments.

Figure 5A:
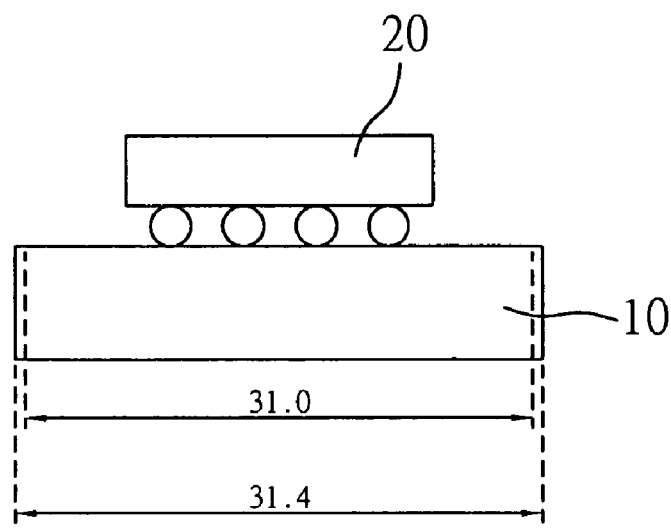
FIGS. 5A to 5I are schematic diagrams showing steps of a method for fabricating semiconductor packages according to a third preferred embodiment of the present invention.
Figure 5B:
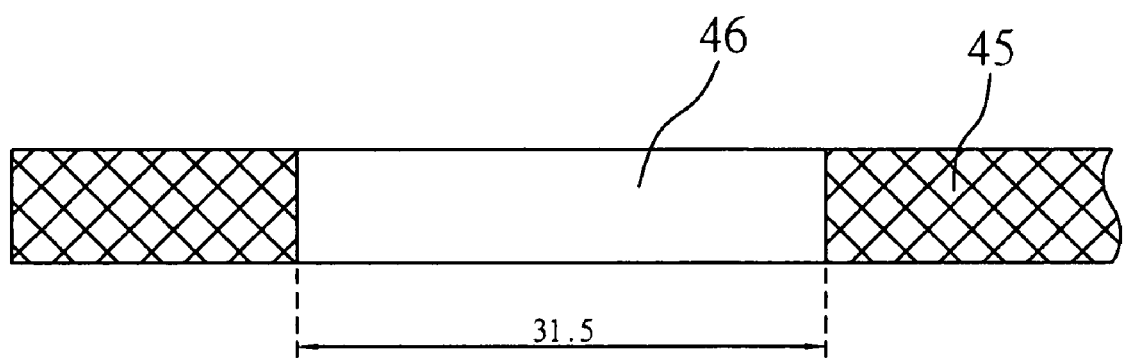
Figure 5C:
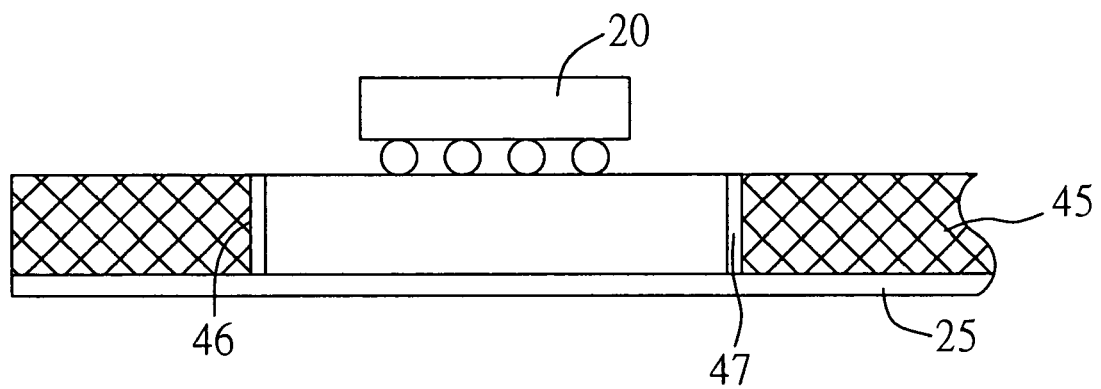
Figure 5D:
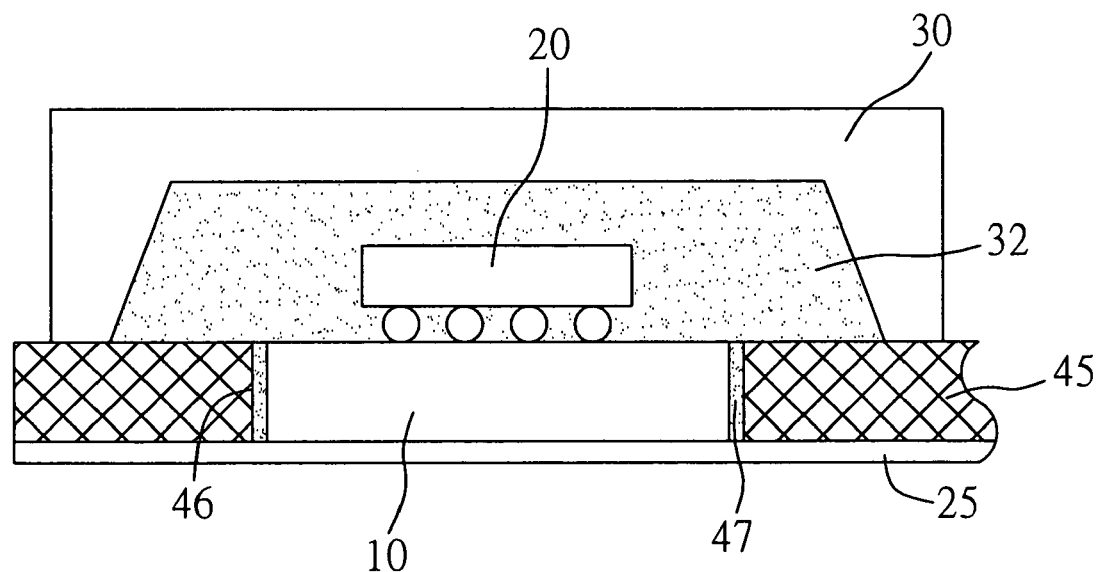
Figure 5E:
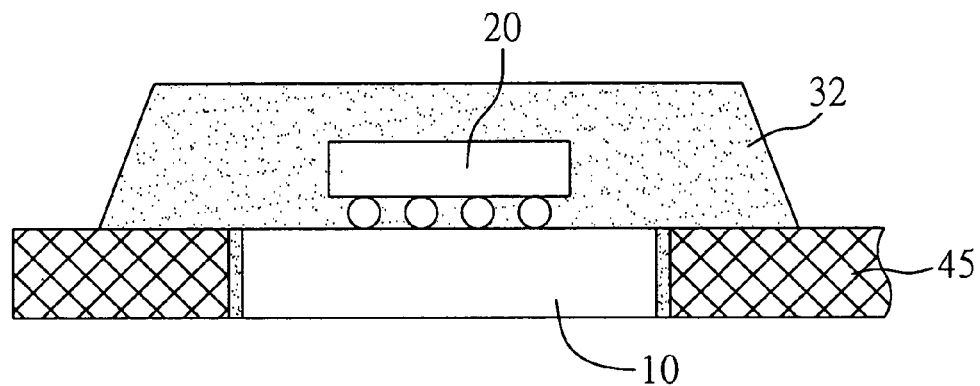

Referring to FIG. 5A, firstly, a plurality of build-up substrates 10 (only one is shown) each carrying at least one chip 20 thereon are prepared. The length and width of each of the substrates 10 are 31.4 mm×31.4 mm, and the predetermined length and width of the semiconductor package 1 after singulation are 31 mm×31 mm. Referring to FIG. 5B, a substrate carrier 45 having a plurality of openings 46 (only one is shown) is prepared. The length and width of each of the openings 46 are 31.5 mm×31.5 mm. The carrier 45 is made of a metal material such as copper (Cu), and a metal layer is in advance plated on a surface of the carrier 45 and made of such as gold (Au), nickel (Ni), or chromium (Cr), etc. that is poorly adhesive to an encapsulant 32. Alternatively, the substrate 10 and the opening 46 can be sized according to the above second embodiment. Referring to FIGS. 5C, 5D and 5E, the plurality of substrates 10 are positioned in the plurality of corresponding openings 46 (only one is shown) of the carrier 45 respectively. A tape 25 is used to seal gaps 47 between the substrates 10 and the carrier 45 to prevent the flashes from penetrating the carrier 45. Subsequently, a molding process is performed to form the encapsulant 32 over each of the openings 46. Finally, a mold-releasing process is performed, and the tape 25 is removed. These steps are similar to those in the foregoing embodiments. Similarly, the problems of resin flashes and mold releasing can be solved without increasing the size of the substrate 10 by this embodiment of the present invention.

Figure 5F:
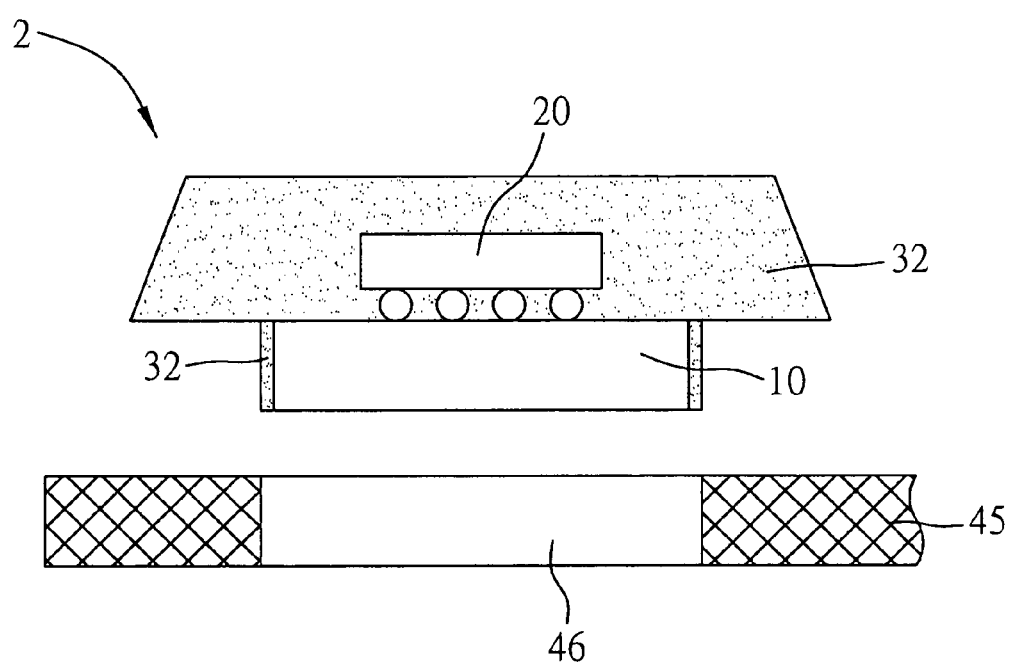

Since the carrier 45 is in advance plated with the metal layer that is poorly adhesive to the encapsulant 32, the adhesion at an interface between the encapsulant 32 and the carrier 45 is quite small and these two materials can be easily separated from each other. Referring to FIG. 5F, the substrate 10 and the chip 20 encapsulated by the encapsulant 32, together forming a package unit 2, are removed from the corresponding opening 46 of the carrier 45, making the carrier 45 separated from the package unit 2 that is to be subjected to singulation.

Figure 5G:
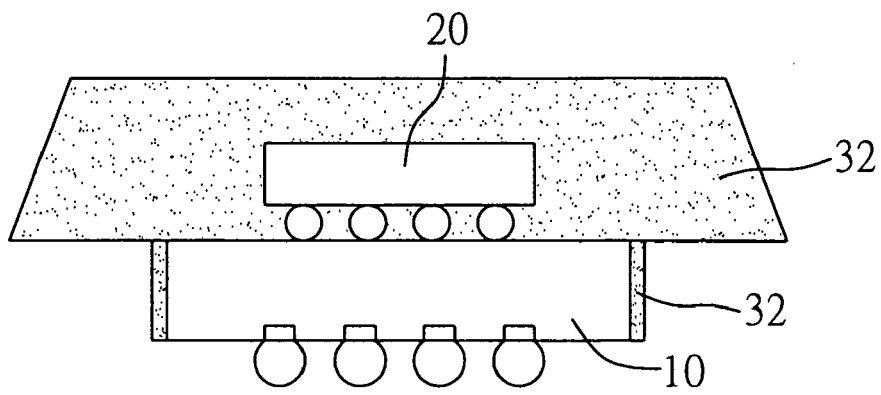
Figure 5H:
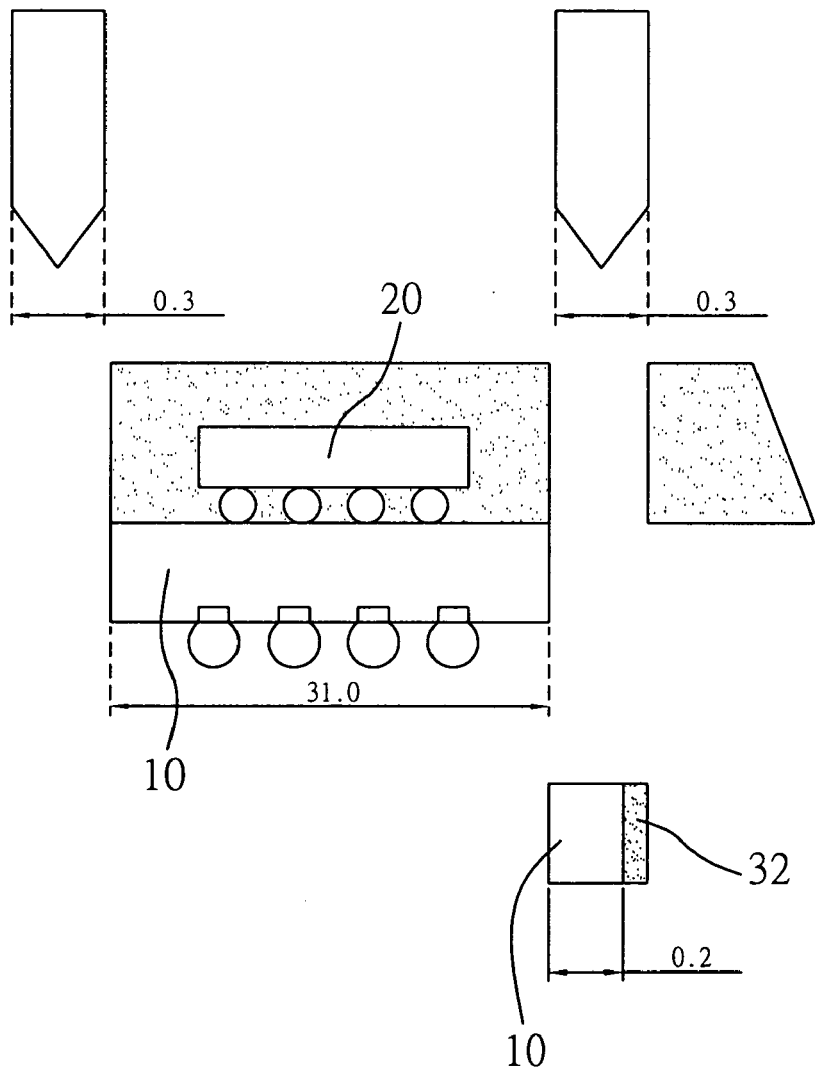
Figure 5I:
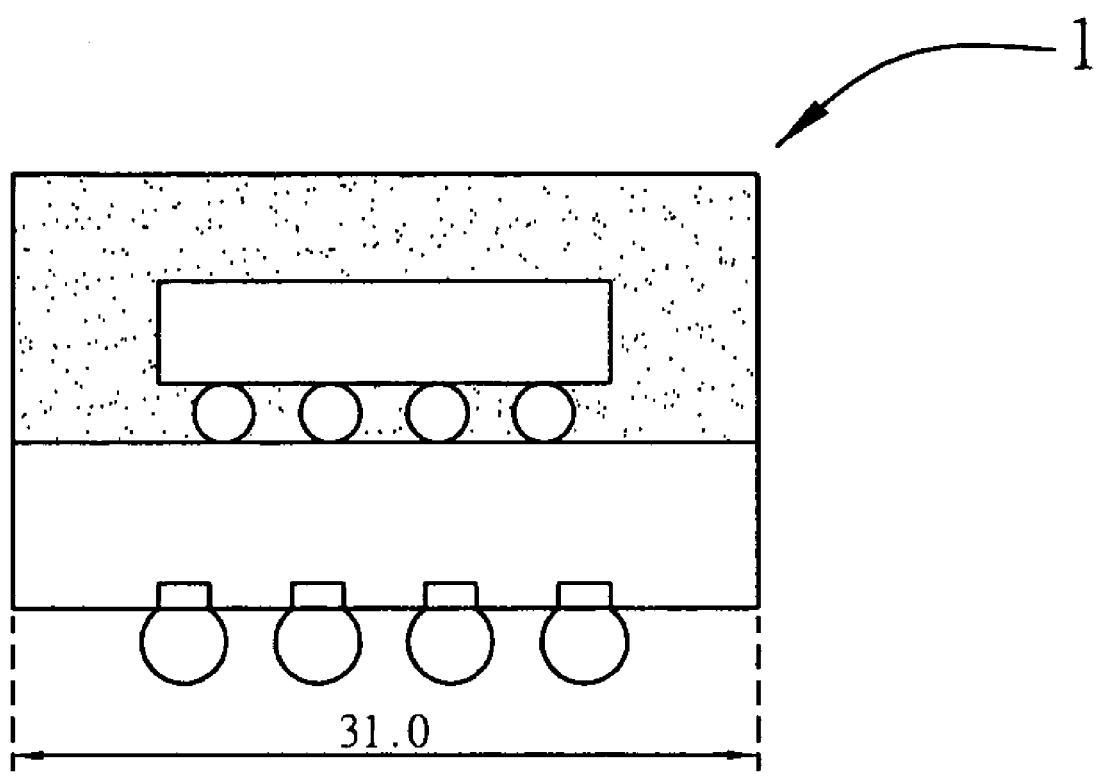

Finally, referring to FIGS. 5G, 5H and 5I, a process of implanting solder balls and a singulation process are successively performed similarly as those described in the above embodiments, so as to form the semiconductor package 1 with the predetermined size according to the third embodiment of the present invention. In this embodiment, as the package unit 2 is separated from the carrier 45 before the singulation process, the carrier 45 would not be cut during singulation, thereby further improving the convenience in fabrication.

Fourth Preferred Embodiment

Figure 6:
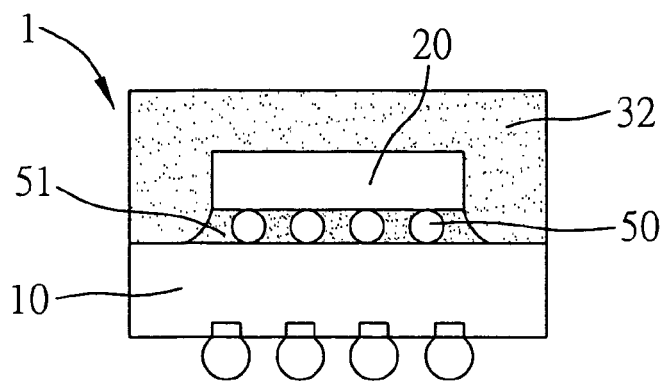
FIG. 6 is a cross-sectional diagram of a semiconductor package fabricated by a method according to a fourth preferred embodiment of the present invention.

In the foregoing embodiments, the molding process is performed to allow the encapsulant 32 to encapsulate the chip 20 (flip chip) and solder bumps that are used to electrically connect the flip chip 20 to the substrate 10. However, in a fourth preferred embodiment shown in FIG. 6, an additional underfilling process is carried out to use an underfill material 51 such as epoxy resin to encapsulate the solder bumps 50 and fill a gap between the flip chip 20 and the substrate 10 prior to the molding process. This can further enhance the mechanical strength of the solder bumps 50 and assure electrical performances of the semiconductor package 1.

Fifth Preferred Embodiment

Figure 7:
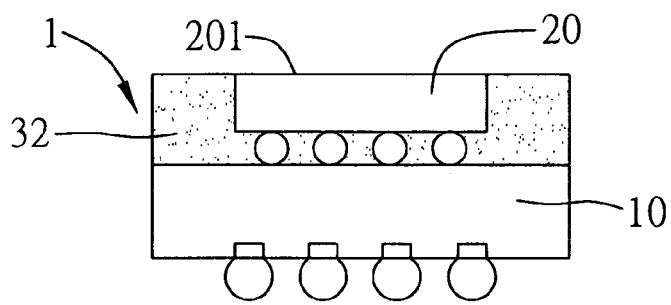
FIG. 7 is a cross-sectional diagram of a semiconductor package fabricated by a method according to a fifth preferred embodiment of the present invention.

In a fifth preferred embodiment shown in FIG. 7, the encapsulant 32 of the semiconductor package 1 can be subjected to a grinding process. Referring to FIG. 7, the encapsulant 32 is ground to expose a non-active surface 201 of the chip 20 from the encapsulant 32, such that the heat dissipating efficiency is improved and the height of the semiconductor package 1 is further reduced.

Sixth Preferred Embodiment

Figure 8:
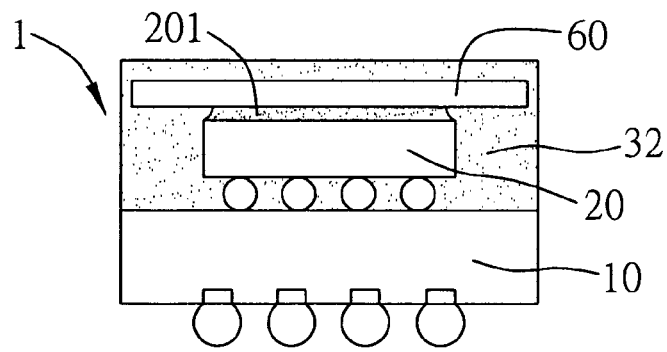
FIG. 8 is a cross-sectional diagram of a semiconductor package fabricated by a method according to a sixth preferred embodiment of the present invention.

Alternatively, in a sixth preferred embodiment shown in FIG. 8, a heat sink 60 can be attached to the non-active surface 201 of the chip 20 prior to the molding process for forming the encapsulant 32. This can similarly improve the overall heat dissipating efficiency of the semiconductor package 1.

Seventh Preferred Embodiment

Figure 9:
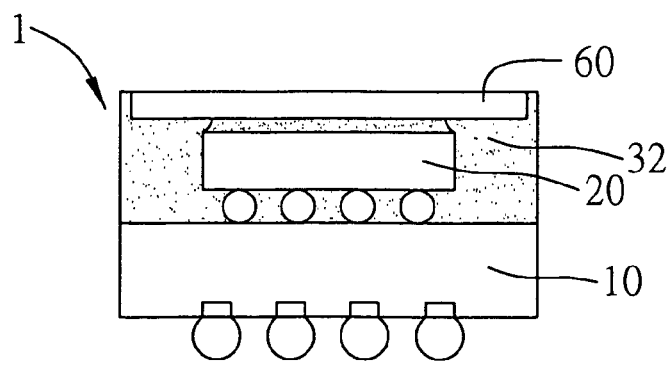
FIG. 9 is a cross-sectional diagram of a semiconductor package fabricated by a method according to a seventh preferred embodiment of the present invention.
Figure 10:
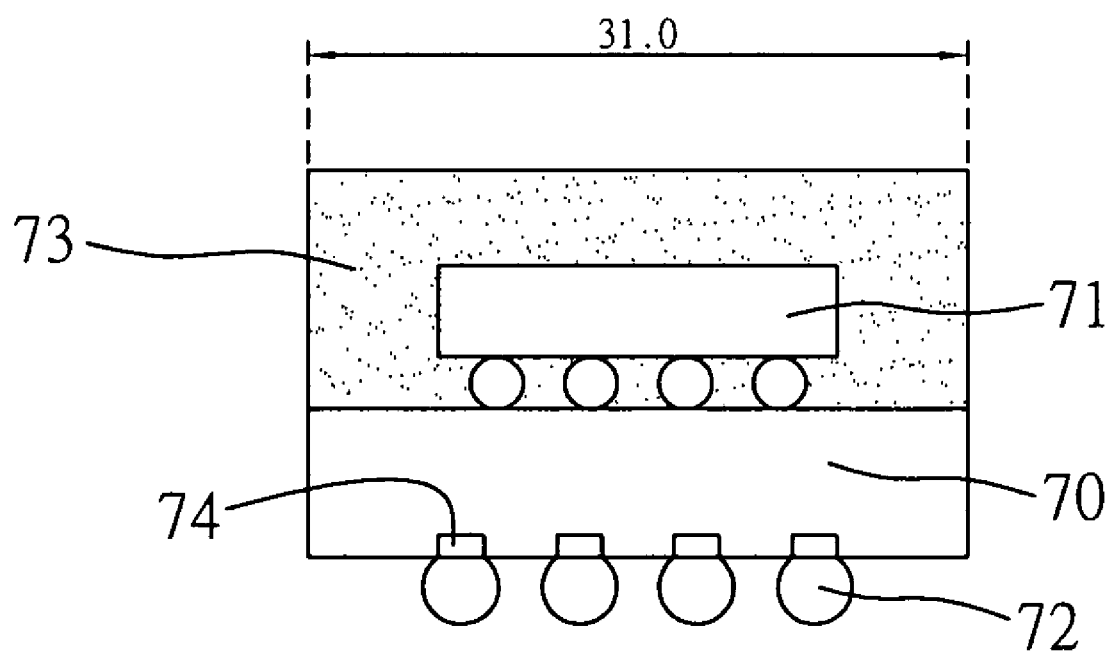
FIG. 10 (PRIOR ART) is a cross-sectional diagram of a conventional FCBGA semiconductor package.
Figure 11:
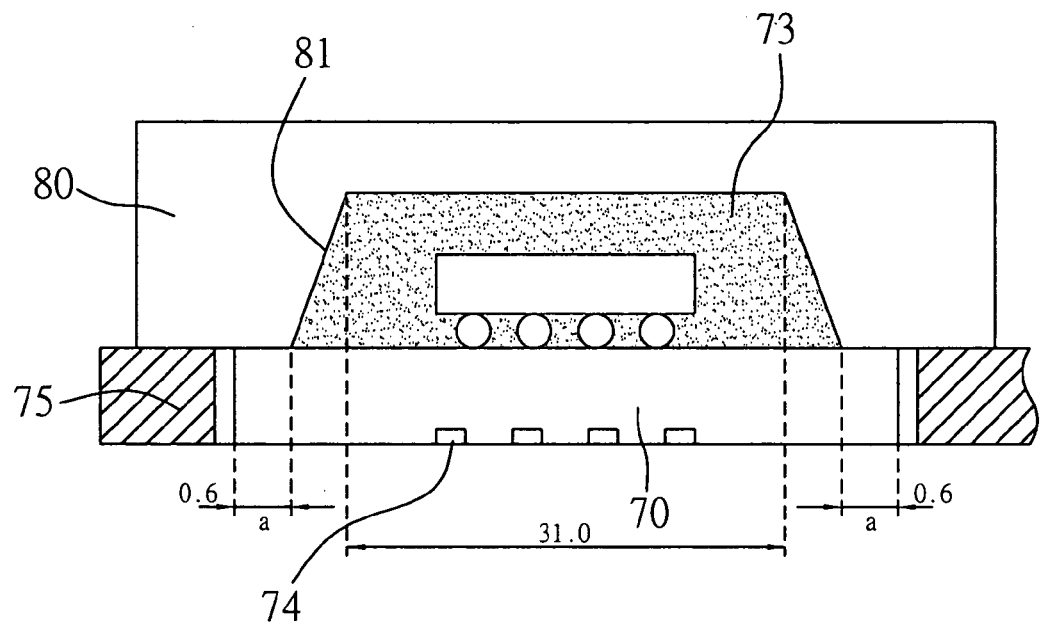
FIGS. 11 and 12 (PRIOR ART) are schematic diagrams showing an increased size of a substrate used in a molding process for the conventional FCBGA semiconductor package.

In a seventh preferred embodiment shown in FIG. 9, the semiconductor package 1 can be subjected to a grinding process to remove a portion of the encapsulant 32 located on the heat sink 60. Thus, the heat sink 60 is partly exposed from the encapsulant 32 to further improve the heat dissipating efficiency.

The fabrication methods and the materials used in the foregoing embodiments may slightly differ from each other. However, all of the embodiments have the same aspects that the length and width of the substrate 10 are similar or substantially equal to the predetermined length and width of the semiconductor package 1, and the gaps 17, 47 between the substrates 10 and the carrier 15, 45 are sealed, as well as the coverage of the mold cavity 31 used for forming the encapsulant 32 is larger in length and width than the opening 16, 46 of the carrier 15, 45. These features can solve the problems of resin flashes and mold releasing, and avoid an undesirable size increase and material waste of the substrate 10, thereby reducing the material cost of the substrate 10 and providing simplified fabrication processes and an advantage in mass production.

The present invention provides specific designs of dimensions and fabrication processes. It is understood that a method of electrical connection for the chip is not particularly limited in the present invention. Besides being electrically connected to the substrate in a flip-chip manner in the foregoing embodiments, the chip can also be electrically connected to the substrate via bonding wires in the present invention through the use of an appropriate substrate and mold.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating semiconductor packages, comprising the steps of:
   preparing a plurality of substrates, wherein length and width of each of the substrates are similar to predetermined length and width of the semiconductor package respectively, and each of the substrates is mounted with at least one chip thereon; and preparing a carrier having a plurality of openings, wherein each of the openings is larger in length and width than each of the substrates;
   positioning the plurality of substrates in the plurality of openings of the carrier respectively, and sealing gaps between the substrates and the carrier;
   performing a molding process to form an encapsulant over each of the openings to encapsulate the corresponding chip, wherein an area on the carrier covered by the encapsulant is larger in length and width than the corresponding opening;
   performing a mold-releasing process; and
   performing a singulation process to cut along substantially edges of each of the substrates according to the predetermined length and width of the semiconductor package, so as to form a plurality of the semiconductor packages.

2. The method of claim 1, further comprising a step of implanting a plurality of solder balls on a surface of each of the substrates free of mounting the chip after the mold-releasing process.

3. The method of claim 1, wherein a filling material is filled in the gaps between the substrates and the carrier to seal the gaps and fix the substrates in the corresponding openings.

4. The method of claim 1, wherein at least one tape is attached to the substrates and the carrier to seal the gaps between the substrates and the carrier and fix the substrates in the corresponding openings.

5. The method of claim 1, wherein the length and width of the substrate are larger by 0.1 to 0.5 mm respectively than the predetermined length and width of the semiconductor package.

6. The method of claim 1, wherein the length and width of the opening are larger by 0.1 to 0.5 mm respectively than those of the substrate.

7. The method of claim 1, wherein the length and width of the substrate are smaller by 0.1 to 0.5 mm respectively than the predetermined length and width of the semiconductor package.

8. The method of claim 1, wherein the length and width of the opening are larger by 0.1 to 1.0 mm respectively than the predetermined length and width of the semiconductor package.

9. The method of claim 1, wherein the carrier is made of an organic insulating material selected from the group consisting of FR4, FR5 and BT.

10. The method of claim 1, wherein the chip is partly exposed from the encapsulant.

11. The method of claim 1, wherein a heat sink is mounted on a surface of the chip free of being mounted to the substrate.

12. The method of claim 11, wherein the heat sink is partly exposed from the encapsulant.

13. A method for fabricating semiconductor packages, comprising the steps of:
   preparing a plurality of substrates, wherein length and width of each of the substrates are similar to predetermined length and width of the semiconductor package respectively, and each of the substrates is mounted with at least one chip thereon; and preparing a metal carrier having a plurality of openings, wherein each of the openings is larger in length and width than each of the substrates;
   positioning the plurality of substrates in the plurality of openings of the metal carrier respectively, and sealing gaps between the substrates and the metal carrier;
   performing a molding process to form an encapsulant over each of the openings to encapsulate the corresponding chip, such that the corresponding substrate, chip and encapsulant form a package unit, wherein an area on the metal carrier covered by the encapsulant is larger in length and width than the corresponding opening;
   performing a mold-releasing process;
   separating the package units from the metal carrier; and
   performing a singulation process to cut along substantially edges of each of the substrates of the package units according to the predetermined length and width of the semiconductor package, so as to form a plurality of the semiconductor packages.

14. The method of claim 13, wherein the metal carrier is made of a copper (Cu) material.

15. The method of claim 13, wherein a metal layer that is poorly adhesive to the encapsulant is plated on a surface of the metal carrier.

16. The method of claim 15, wherein the metal layer is made of a material selected from the group consisting of gold (Au), nickel (Ni) and chromium (Cr).

17. The method of claim 13, further comprising a step of implanting a plurality of solder balls on a surface of each of the substrates free of mounting the chip after the mold-releasing process.

18. The method of claim 13, wherein a filling material is filled in the gaps between the substrates and the carrier to seal the gaps and fix the substrates in the corresponding openings.

19. The method of claim 13, wherein at least one tape is attached to the substrates and the carrier to seal the gaps between the substrates and the carrier and fix the substrates in the corresponding openings.

20. The method of claim 13, wherein the length and width of the substrate are larger by 0.1 to 0.5 mm respectively than the predetermined length and width of the semiconductor package.

21. The method of claim 13, wherein the length and width of the opening are larger by 0.1 to 0.5 mm respectively than those of the substrate.

22. The method of claim 13, wherein the length and width of the substrate are smaller by 0.1 to 0.5 mm respectively than the predetermined length and width of the semiconductor package.

23. The method of claim 13, wherein the length and width of the opening are larger by 0.1 to 1.0 mm respectively than the predetermined length and width of the semiconductor package.

24. The method of claim 13, wherein the chip is partly exposed from the encapsulant.

25. The method of claim 13, wherein a heat sink is mounted on a surface of the chip free of being mounted to the substrate.

26. The method of claim 25, wherein the heat sink is partly exposed from the encapsulant.

* * * * *